United States Patent
Lim et al.

(10) Patent No.: US 6,930,939 B2
(45) Date of Patent: Aug. 16, 2005

(54) SEMICONDUCTOR MEMORY DEVICE HAVING HIERARCHICAL STRUCTURE OF DATA INPUT/OUTPUT LINE AND PRECHARGE METHOD THEREOF

(75) Inventors: Kyu-Nam Lim, Yongin (KR); Kyu-Hyun Kyung, Yongin (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 146 days.

(21) Appl. No.: 10/660,568

(22) Filed: Sep. 12, 2003

(65) Prior Publication Data

US 2004/0085841 A1 May 6, 2004

(30) Foreign Application Priority Data

Nov. 1, 2002 (KR) ................................. 10-2002-0067405

(51) Int. Cl.[7] ................................................. G11C 7/00
(52) U.S. Cl. ........................ 365/203; 365/190; 365/205
(58) Field of Search .................................. 365/190, 203, 365/205

(56) References Cited

U.S. PATENT DOCUMENTS

| 4,962,324 | A | | 10/1990 | Park ............................ 327/51 |
|---|---|---|---|---|
| 5,642,314 | A | * | 6/1997 | Yamauchi ................... 365/203 |
| 5,650,980 | A | * | 7/1997 | Sakurai et al. .............. 365/203 |
| 5,946,252 | A | * | 8/1999 | Arimoto ...................... 365/205 |
| 6,771,550 | B2 | * | 8/2004 | Park ............................. 365/203 |

* cited by examiner

*Primary Examiner*—Son Mai
(74) *Attorney, Agent, or Firm*—Harness, Dickey & Pierce, PLC

(57) ABSTRACT

A semiconductor memory device having a hierarchical structure of data input/output lines and a precharge method thereof. A precharge method in a semiconductor memory device having a hierarchical structure includes precharging the global input/output line pairs with half of a memory cell array voltage, and precharging the local input/output line pairs with the half of the memory cell array voltage.

7 Claims, 5 Drawing Sheets

US 6,930,939 B2

SEMICONDUCTOR MEMORY DEVICE HAVING HIERARCHICAL STRUCTURE OF DATA INPUT/OUTPUT LINE AND PRECHARGE METHOD THEREOF

This U.S. nonprovisional patent application claims priority under 35 U.S.C. §119 of Korean Patent Application 2002-67405 filed on Nov. 01, 2002, the entire contents of which is hereby incorporated by reference.

FIELD OF THE INVENTION

The present invention relates to a semiconductor memory device, and more particularly, to a precharge method of precharging a local input/output line and a global input/output line in a semiconductor memory device with data input/output lines having a hierarchical structure.

DESCRIPTION OF THE RELATED ART

A semiconductor memory device generally employs a sense amplifier for sensing data of each cell. To speed up an operation of the sense amplifier, the sense amplifier may be equalized. Techniques for equalizing a sense amplifier are disclosed in the U.S. Pat. No. 4,962,324 published on Oct. 09, 1990. U.S. Pat. No. 4,962,324 discloses a sense amplifier equalizing circuit that is resistant against Vcc or Vss noise, in which a sufficient equalization time is provided in a standby state and the equalization operation is stopped only when sensing and amplifying data of an SRAM cell. Thus the sense amplifier amplifies the data only after an output of the sense amplifier is completely equalized.

Semiconductor memory devices also perform a burst operation for which plural data inputs/outputs are continuously executed, to obtain a high speed operation. In a burst operation, a data input/output line may be used, divided into a local data input/output line and a global data input/output line, which may be connected through a switching device.

Further, in a semiconductor memory device with a stack bank structure, a word line and a local data input/output line pair are disposed in the same direction, and the local data input/output line pair and a global data input/output line pair are crosswise.

In a semiconductor memory device with a stack bank structure, a plurality of memory cell array banks are disposed in a word line direction, and a plurality of memory cell array blocks in each of the plurality of memory cell array banks are also disposed in the word line direction. Each of the plurality of memory cell array blocks is divided into a constant number of sub-blocks, and each of the divided constant number of sub-blocks is connected to the divided local data input/output line pairs, and the divided local data input/output line pairs are each connected to a plurality of global data input/output line pairs that are part of a constant number of groups.

As described above, in the conventional art a semiconductor memory device in which the local data input/output line pairs and the global data input/output line pairs are crosswise connected with each other, a data bus line precharge apparatus is constructed to precharge a global data bus line pair with a power potential level after a write operation, and a local data bus precharge apparatus is constructed to precharge a local data bus line pair with the power potential level.

FIG. 1 is a circuit diagram of a data input/output control apparatus having a conventional hierarchical structure.

The data input/output control apparatus shown in FIG. 1 includes a pair of bitlines BL, /BL connected to a memory cell, a bitline sense amplifier 10 connected to the pair of bitlines BL, /BL, a column selector 12 connected between the bitline sense amplifier 10 and a pair of local input/output lines LIO, /LIO, for selecting a corresponding bitline in response to a column selection signal CSL referred to FIG. 2, a local input/output line precharge part 14 connected between the pair of local input/output lines LIO, /LIO, for precharging the pair of local input/output lines LIO, /LIO with a memory cell array voltage Vcc by a word line precharge command WPRCB, a local input/output line sense amplifier 16 connected between the pair of local input/output lines LIO,/LIO, for sensing and amplifying data of the pair of local input/output lines LIO,/LIO, a pair of global input/output lines GIO, /GIO crosswise connected with the pair of local input/output lines LIO, /LIO, a write driver 20 for receiving the data and loading the data on the pair of global input/output lines GIO, /GIO, a global input/output line precharge part 18 for precharging the one pair of global input/output lines GIO, /GIO with the memory cell array voltage Vcc in response to a global input/output line precharge signal GIOPRB, a bank selector 22 connected between the pair of global input/output lines GIO, /GIO, for selecting a corresponding bank in response to a bank selection signal BKSE1, a global input/output sense amplifier 26 connected between the pair of global input/output lines GIO, /GIO, for receiving an input/output sense amplifier enable signal to sense and amplify data of the pair of global input/output lines GIO, /GIO, and a sense amplifier global input/output line precharge part 24 connected between the bank selector 22 and the global input/output sense amplifier 26, for precharging a pair of sense amplifier global input/output lines SGIO, /SGIO with the memory cell array voltage Vcc in response to a sense amplifier global input/output line precharge signal SGIOPRB.

During a write operation, a write enable signal WE is applied to drive the write driver 20, and the write driver 20 loads data applied to a data input buffer, on the pair of global input/output lines GIO, /GIO. Then the data is transferred to the pair of local input/output lines LIO, /LIO. At this time, a designated column selector 12 is turned on by the column selection signal shown in FIG. 2 during a write operation (WRITE). Thus the data of the pair of local input/output lines LIO, /LIO is transferred to the bitline through the bitline sense amplifier 10 and is written to a memory cell.

Once the data was written to the memory cell, the pair of local input/output lines LIO, /LIO and the pair of global input/output lines GIO, /GIO must be precharged to be the same level as the precharged level before the writing operation.

During a precharge operation, once the global input/output line precharge signal GIOPRB is applied when a bank selector 22 is turned off by the bank selection signal BKSE1, the PMOS transistor 50 and PMOS transistors 52, 54 are turned on. Thus, the pair of global input/output lines GIO, /GIO is precharged with the memory cell array voltage Vcc.

When the corresponding column selector 12 is turned off by the column selection signal CSL during time intervals T1 and T2 referred to FIG. 2, the pair of local input/output lines LIO, /LIO is precharged for 4.90 nS as shown in FIG. 2 with the memory cell array voltage Vcc through the precharge operation of the one pair of global input/output lines GIO, /GIO.

Once the sense amplifier global input/output line precharge signal SGIOPRB is applied when the corresponding bank selector 22 is turned off by the bank selection signal BKSE1, the PMOS transistor 60 and PMOS transistors 62, 64 are turned on. Thus a pair of sense amplifier global input/output lines SGIO, /SGIO is precharged with the memory cell array voltage Vcc.

At this time, the local input/output line precharge part 14 is activated by the word line precharge command signal WPRCB applied to gates of the PMOS transistor 30 and PMOS transistors 32, 34 to perform a precharge operation with the memory cell array voltage Vcc.

Subsequently, once a read command is inputted in a next cycle, the read operation is performed. In the read operation, data read from a memory cell is loaded on the pair of bitlines BL, /BL, and then be amplified by the bitline sense amplifier 10. At this time, the designated column selector 12 is turned on by the column selection signal GSL during the read operation shown in FIG. 2, and the data loaded on the pair of bitlines BL, /BL is transferred to the pair of local input/output lines LIO, /LIO. Also, at this time, in the local input/output line sense amplifier 16, NMOS transistors 36, 38, 40, 42 are turned on and one of NMOS transistors 44, 46 is turned on. Thus, the data loaded on one pair of local input/output lines LIO, /LIO is sensed and amplified to be loaded on the pair of global input/output lines GIO, /GIO.

And then, when the corresponding bank selector 22 is turned on by the bank selection signal BKSE1, the data loaded on the pair of global input/output lines GIO, /GIO is amplified by the global input/output sense amplifier 26 and to be transmitted to the data output buffer through a pair of input/output lines IO, /IO.

As shown in FIG. 2, the data input/output control apparatus having such a conventional hierarchical structure has a disadvantage of an increase of a write and read (WRITE-READ) cycle time when performing the precharge operation with the memory cell array voltage Vcc.

SUMMARY OF THE INVENTION

In exemplary embodiments, the present invention provides a semiconductor memory device having a hierarchical structure of data input/output line to reduce a write-read cycle time and a precharge time by precharging with a half voltage of a memory cell array voltage. In exemplary embodiments, the present invention also includes a method of precharging a semiconductor memory device having such a hierarchical structure.

In an exemplary embodiment of the present invention, a semiconductor memory device having a hierarchical structure in which bitline pairs are connected with local input/output line pairs and the local input/output line pairs are connected with global input/output line pairs, a precharge method includes precharging the global input/output line pairs with half of a memory cell array voltage, and precharging the local input/output line pairs with half of the memory cell array voltage.

In another exemplary embodiment of the present invention, a semiconductor memory device having a hierarchical structure includes one pair of bitlines connected to a memory cell, one pair of local input/output lines connected to the one pair of bitlines, one pair of global input/output lines crosswise connected to the one pair of local input/output lines, and a global input/output line precharge part for precharging the one pair of global input/output lines with a half voltage of a memory cell array voltage in response to a global input/output line precharge signal.

In another exemplary embodiment of the present invention, semiconductor memory device having a hierarchical structure includes one pair of bitlines connected to a memory cell, a bitline sense amplifier connected to the pair of bitlines, a column selector connected between the pair of bitlines and one pair of local input/output lines, for selecting a corresponding bitline in response to a column selection signal, a local input/output line sense amplifier connected between the pair of local input/output lines, for sensing and amplifying data of the one pair of local input/output lines in response to a local input/output line sense amplifier drive signal, one pair of global input/output lines crosswise connected to the pair of local input/output lines, a write driver for receiving the data and loading the data on the pair of global input/output lines, and a global input/output line precharge part for precharging the pair of global input/output lines with half of a memory cell array voltage in response to a global input/output line precharge signal.

BRIEF DESCRIPTION OF THE DRAWINGS

The above and other features of the present invention will become readily apparent from the description of exemplary embodiments that follows with reference to the accompanying drawings, in which like reference numerals and symbols designate like elements, in which.

DETAILED DESCRIPTION OF EXEMPLARY EMBODIMENTS OF THE INVENTION

The present invention and exemplary embodiments thereof are more fully described below with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. In the inventive description, details of widely known functions of constructions will be omitted for the sake of brevity.

In a semiconductor memory device having a hierarchical structure, a precharge method of a data input/output apparatus is provided in such a structure that one pair of bitlines BL, /BL is connected to one pair of local input/output lines LIO,/LIO, and the one pair of local input/output lines LIO,/LIO is connected to one pair of global input/output lines GIO, /GIO.

Figure 1:
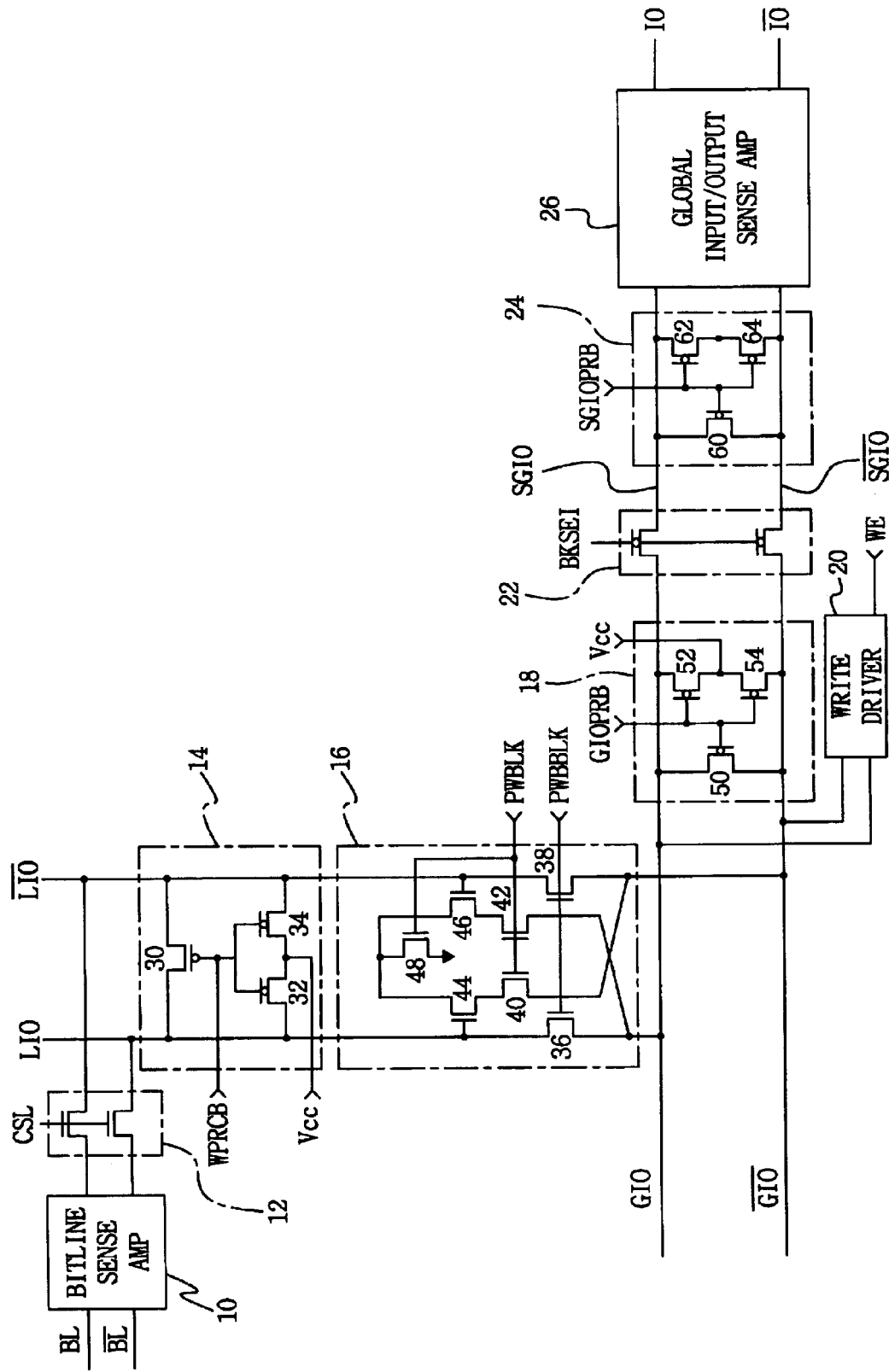
FIG. 1 is a circuit diagram illustrating a data input/output control apparatus having a conventional hierarchical structure.
Figure 2:
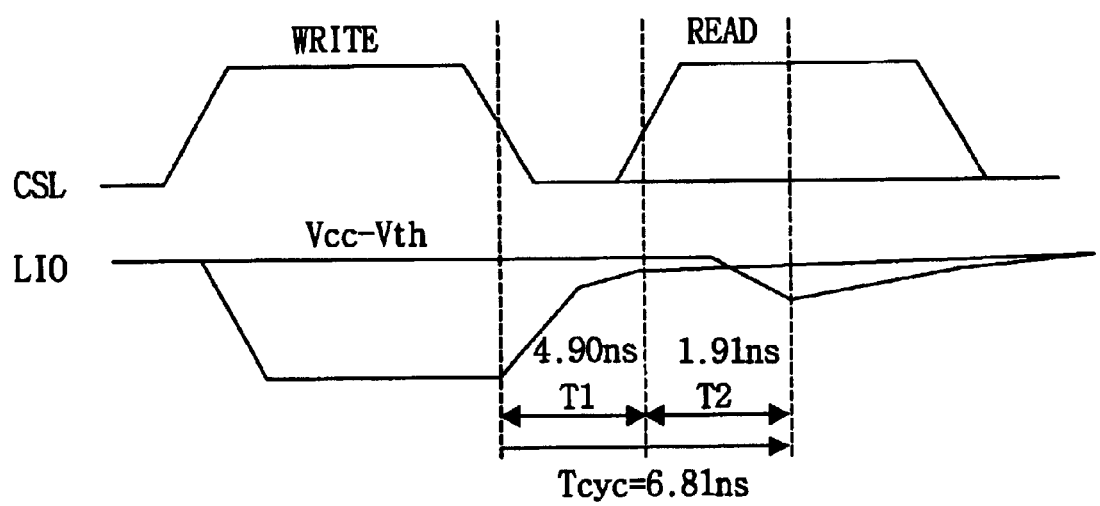
FIG. 2 is a waveform diagram illustrating a write-read cycle time in precharging the apparatus referred in FIG. 1 with a memory cell array voltage
Figure 3:
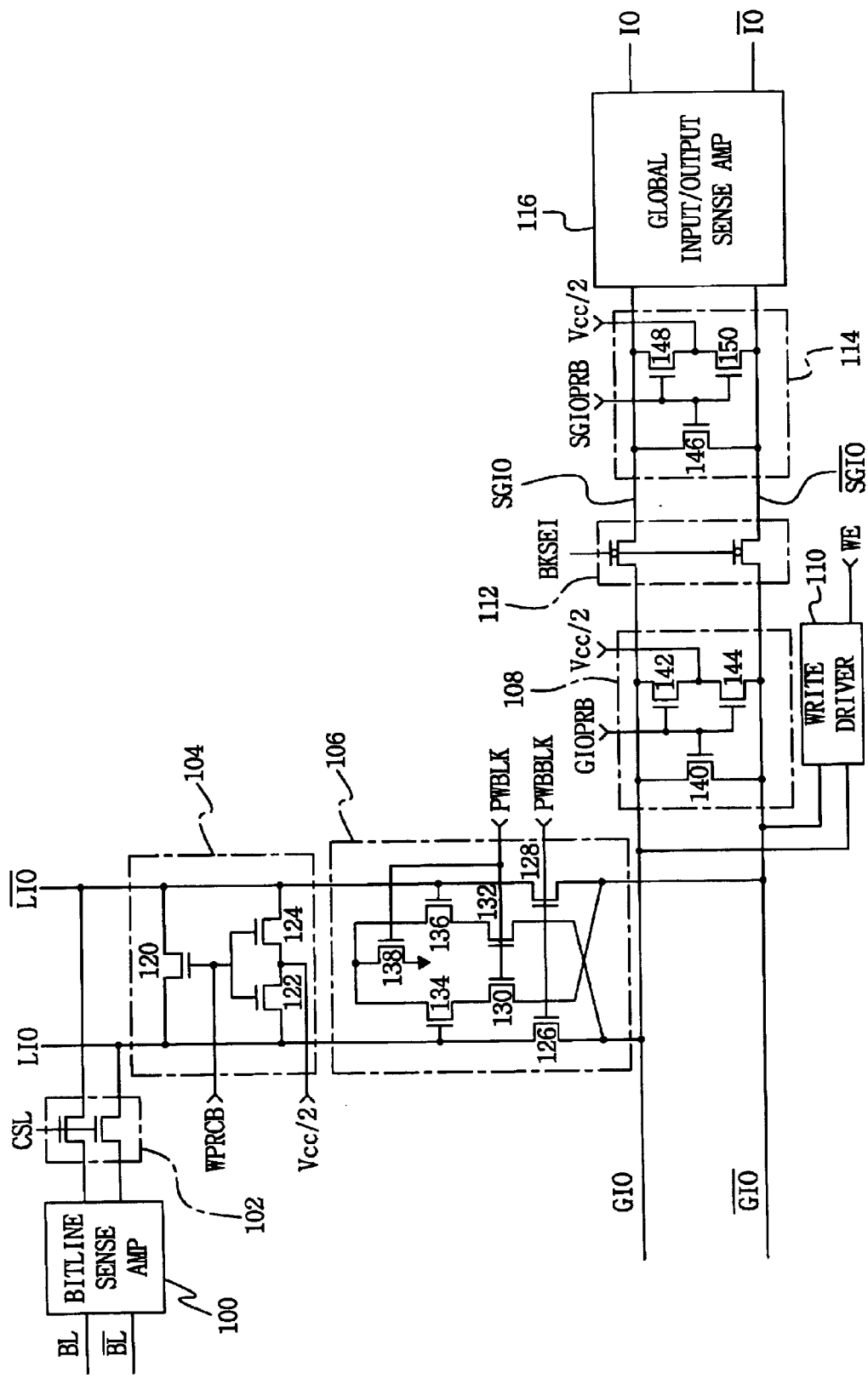
FIG. 3 is a circuit diagram illustrating a data input/output control apparatus having a hierarchical structure according to an exemplary embodiment of the present invention.

FIG. 3 is a circuit diagram illustrating a data input/output control apparatus having a hierarchical structure according to one exemplary embodiment of the present invention.

The data input/output control apparatus shown in FIG. 3 includes a pair of bitlines BL, /BL connected to a memory cell, a bitline sense amplifier 100 connected to one pair of bitlines BL, /BL, a column selector 102 connected between the bitline sense amplifier 100 and a pair of local input/output lines LIO, /LIO, for selecting a corresponding bitline in response to a column selection signal CSL, a local input/output line precharge part 104 connected between the pair of local input/output lines LIO, /LIO, for receiving a word line precharge command WPRCB to precharge one pair of local input/output lines LIO, /LIO with a half of the memory cell array voltage Vcc, a local input/output line sense amplifier 106 connected between the pair of local input/output lines LIO, /LIO, for sensing and amplifying data of the pair of local input/output lines LIO, /LIO in response to a local input/output line sense amplifier drive signal, a pair of global input/output lines GIO, /GIO crosswise connected to the pair of local input/output lines LIO, /LIO, a write driver 110 for receiving the data and loading the data on the pair of global input/output lines GIO, /GIO, a global input/output line precharge part 108 for precharging the pair of global input/output lines GIO, /GIO with the half of the memory cell array voltage Vcc in response to a global input/output line precharge signal GIOPRB, a bank selector 112 connected between the pair of global input/output lines GIO, /GIO, for selecting a corresponding bank in response to a bank selection signal BKSE1, a global input/output sense amplifier 116 connected between the pair of global input/output lines GIO, /GIO, for sensing and amplifying data of the pair of global input/output lines LIO, /LIO, and a sense amplifier global input/output line precharge part 114 connected between the bank selector 112 and the global input/output sense amplifier 116, for precharging the pair of sense amplifier global input/output lines SGIO, /SGIO with the half of the memory cell array voltage Vcc in response to a sense amplifier global input/output line precharge signal SGIOPRB.

Figure 5:
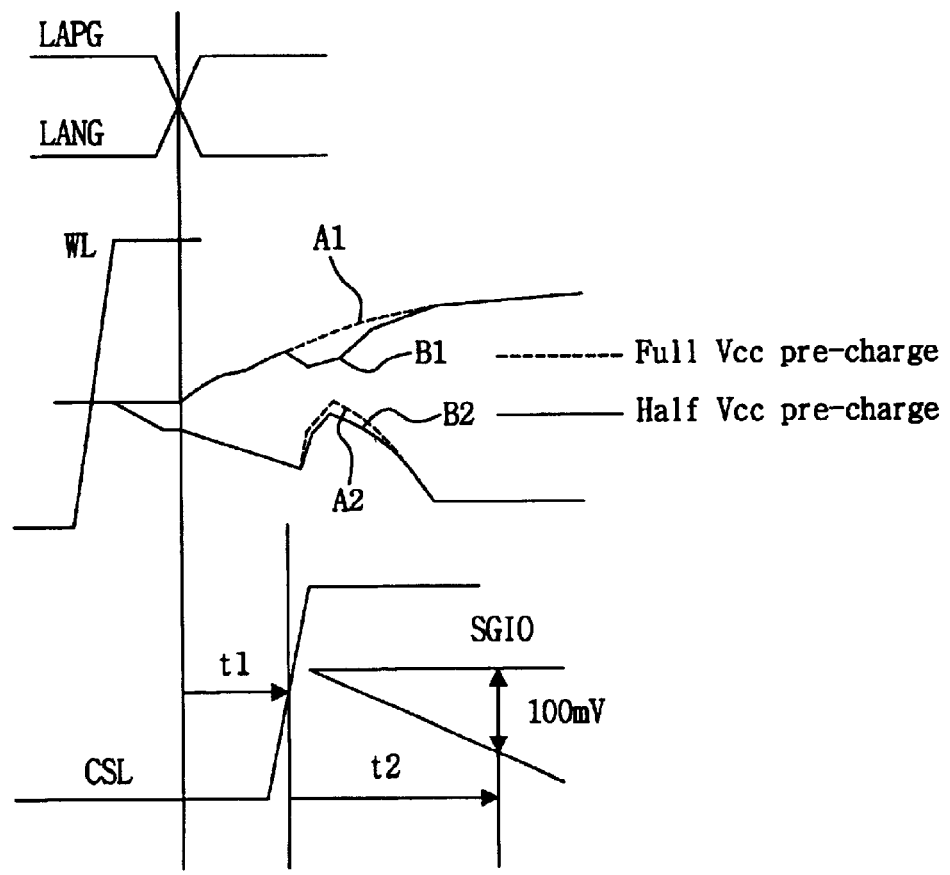
FIG. 5 is a waveform diagram illustrating waveforms of a bitline and a global input/output line in a read operation according to an exemplary embodiment of the present invention.

FIG. 5 illustrates waveforms of a bitline and a global input/output line in a read operation according to an exemplary embodiment of the present invention.

Figure 6:
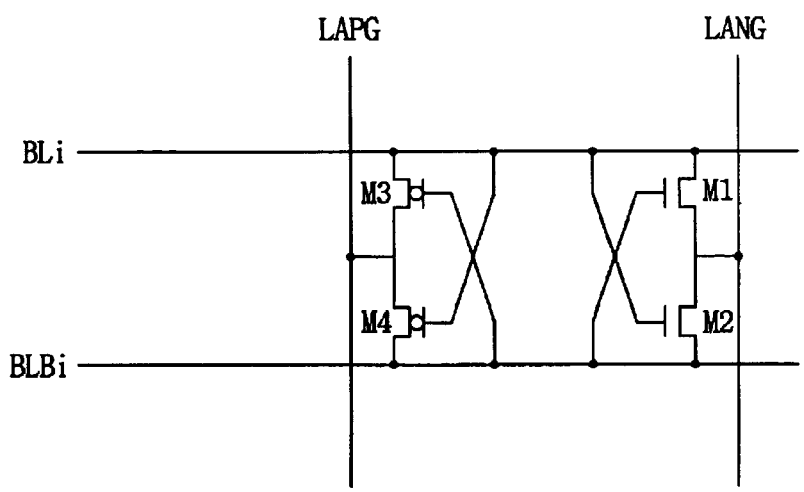
FIG. 6 is a detailed circuit diagram illustrating a bitline sense amplifier referred to FIG. 3 according to an exemplary embodiment of the present invention.

FIG. 6 is a detailed circuit diagram of the bitline sense amplifier 100 referred to FIG. 3 according to an exemplary embodiment of the invention. Referring to FIG. 6, in the bitline sense amplifier 100, two NMOS transistors M1, M2 are connected in series between the bitlines BL and /BL, and two PMOS transistors M3, M4 are connected in series between the bitlines BL and /BL.

Figure 7:
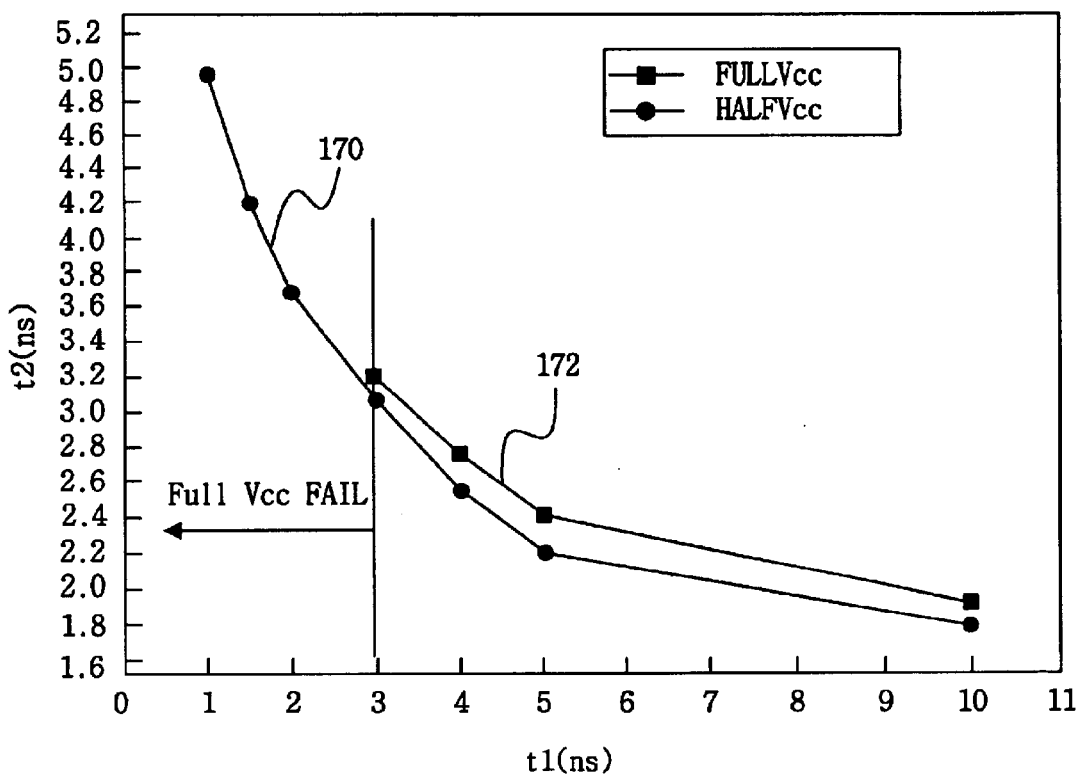
FIG. 7 is a diagram illustrating a characteristic of t2 in a mismatch of a bitline sense amplifier when precharging with a memory cell array voltage and a half of the memory cell array voltage.

FIG. 7 illustrates a characteristic of t2 in a mismatch of the bitline sense amplifier when precharging with a memory cell array voltage and a half of the memory cell array voltage.

With reference to FIGS. 3 through 7, an operation of the exemplary embodiment of the present invention will be described in detail as follows.

In a write operation, a write enable signal WE is applied to drive the write driver 110, and the write driver 110 loads data applied to the data input buffer (not shown) on the pair of global input/output lines GIO, /GIO. NMOS transistors 126, 128 are turned on by the local input/output line sense amplifier drive signal PWBBLK, and the data loaded on the one pair of global input/output lines GIO, /GIO is transferred to the pair of local input/output lines LIO, /LIO. At this time, a designated column selector 102 is turned on by the column selection signal CSL during a write operation (WRITE) referred to FIG. 4 so that the data of the pair of local input/output lines LIO, /LIO is transferred to the bitline through the bitline sense amplifier 100 and written to a memory cell.

After the data was written in the memory cell, the pair of local input/output lines LIO, /LIO and the pair of global input/output lines GIO, /GIO must be precharged to be the same as the precharged level before the write operation.

In the precharge operation, once a global input/output line precharge signal GIOPRB is applied when the corresponding bank selector 112 is turned off by the bank selection signal BKSE1, an NMOS transistor 140 and NMOS transistors 142, 144 are turned ON. Thus, the pair of global input/output lines GIO, /GIO is precharged with the half of the memory cell array voltage Vcc.

Figure 4:
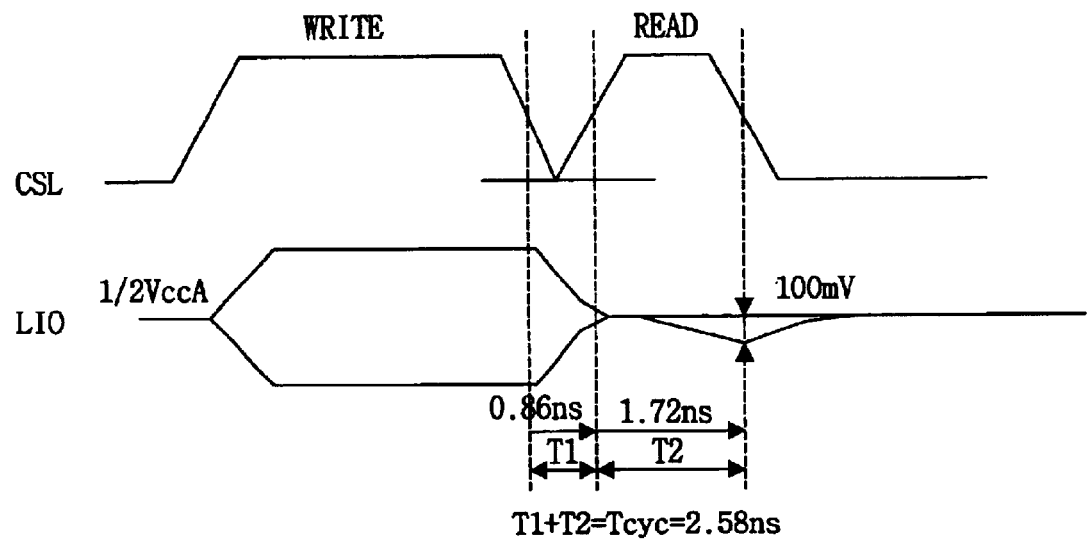
FIG. 4 is a waveform diagram illustrating a write-read cycle time in precharging with a half of the memory cell array voltage according to an exemplary embodiment of the present invention.

The corresponding column selector 102 is turned off in response to the column selection signal CSL of a low state provided during time intervals T1 and T2 referred to FIG. 4. At this time, the NMOS transistors 126, 128 of the local input/output line sense amplifier 106 are turned on by the PWBBLK signal, thus the pair of local input/output lines LIO, /LIO is precharged with the half of the memory cell array voltage Vcc for 0.86 nS as shown in FIG. 4.

Once a sense amplifier global input/output line precharge signal SGIOPRB is applied when the corresponding bank selector 112 is turned off by the bank selection signal BKSE1, the NMOS transistor 146 and NMOS transistors 148, 150 are turned ON. Thus, the pair of sense amplifier global input/output lines SGIO, /SGIO is precharged with half of the memory cell array voltage Vcc.

At this time, the local input/output line precharge part 104 performs a precharge operation with half of the memory cell array voltage Vcc when the word line precharge command WPRCB is applied to gates of the NMOS transistor 120 and NMOS transistors 122, 124.

When a read command is inputted in a next cycle, a read operation is performed. In the read operation, data read from a memory cell is loaded on the pair of bitlines BL, /BL and is amplified by the bitline sense amplifier 100. The designated column selector 102 is turned on by the column selection signal CSL during the read operation (READ) referred to FIG. 4, thus the data loaded on the pair of bitlines BL, /BL is transferred to the pair of local input/output lines LIO, /LIO. At this time, in the local input/output line sense amplifier 106, NMOS transistors 130, 132 are turned on local input/output line sense amplifier drive signal and one of NMOS transistors 134, 136 is turned on, thus the data loaded on the pair of local input/output lines LIO, /LIO is sensed and amplified, and to be loaded on one pair of global input/output lines GIO, /GIO. The NMOS transistor 138 performs a turn-on operation dependently upon the NMOS transistors 130, 132.

Then, when the corresponding bank selector 112 is turned on in response to the bank selection signal BKSE1, the data loaded on the pair of global input/output lines GIO, /GIO is amplified by the global input/output sense amplifier 116 and is transmitted to the data output buffer through a pair of input/output lines IO, /IO.

Referring to FIG. 5, when the global input/output line and the local input/output line are precharged with the conventional Full Vcc, a word line selection signal is applied to begin reading the data from the memory cell and a data sensing is performed in the bitline sense amplifier 100. Here, a high level voltage of the bitline does not have a hurt occurrence as shown in $A_1$ of FIG. 5, while a low level voltage of the bitline has the hurt occurrence as shown in $A_2$ of FIG. 5. When the global input/output line and the local input/output line are precharged by Vcc/2 according to the exemplary embodiment of the present invention, the high and low level voltages of the bitline have an even hurt occurrence as shown in $B_1$ and $B_2$ of FIG. 5.

Referring to FIG. 6, in the bitline sense amplifier 100, NMOS transistors M1, M2 and PMOS transistors M3, M4 are driven by sense amplifier drive signals LANG, LAPG to sense and amplify the data of the bitlines, wherein LANG indicates an NMOS sense amplifier drive signal and LAPG indicates a PMOS sense amplifier drive signal. Here, the two PMOS transistors M1, M2 have a mismatch of about 40 mV threshold. In such a status that the mismatch exists, a characteristic of t2 becomes very different, wherein the t2 indicates a time from when the column selector 102 becomes ON by a rise of the column selection signal CSL to a high level to when the bitline sense amplifier 100 operates and rises to 100 mV. The t1 also indicates a time from when the bitline sense amplifier 100 operates after the word line selection signal is applied as the high level to when the column selection signal CSL rises to a high level and the column selector 102 becomes ON.

In case of precharging with the Vcc level, the bitline data is inverted when t1 is under 3 nS. In case of precharging with the Vcc/2 level, the bitlines BL and /BL equally have the hurt as shown in reference number 170 of FIG. 7, while in case of precharging with Vcc level, only one bitline has the hurt as shown in reference number 172 of FIG. 7, thus a characteristic of the mismatch becomes weak. Therefore, in case of precharging with Vcc/2, characteristics of tRCD (RAS to CAS Delay) and tREF (Refresh time) are improved. Here, the RAS indicates a row address strobe and the CAS indicates a column address strobe.

Accordingly, in a semiconductor memory device having a hierarchical structure, a global input/output line is precharged with half of a memory cell array voltage Vcc, and a local input/output line is precharged by the precharge of the global input/output line, to apply a uniform hurt to the bitlines BL and /BL and prevent a data sensing error through a mismatch characteristic in a sense amplifier, and to improve tRCD and tREF characteristics by precharging the global input/output line and the local input/output line with half of the memory cell array voltage Vcc.

While the present invention has been particularly shown and described with reference to the exemplary embodiments described above, it will be understood by those skilled in the art that these exemplary embodiments do not limit the scope of the present invention. Rather, various changes in form and details may be made without departing from the spirit and scope of the invention as defined by the appended claims.

What is claimed is:

1. A precharge method in a semiconductor memory device having a hierarchical structure in which bitline pairs are connected with local input/output line pairs, and the local input/output line pairs are connected to global input/output line pairs, the method comprising:

precharging the global input/output line pairs with the half of a memory cell array voltage; and precharging the local input/output line pairs with the half of the memory cell array voltage.

2. A semiconductor memory device having a hierarchical structure, comprising:

one pair of bitlines connected to a memory cell;

one pair of local input/output lines;

a column selector connected between the one pair of bitlines and the one pair of local input/output lines, for selecting a corresponding bitline in response to a column selection signal;

a local input/output line sense amplifier connected between the one pair of local input/output lines, for sensing and amplifying data of the one pair of local input/output lines in response to a local input/output line sense amplifier drive signal;

one pair of global input/output lines crosswise connected to the one pair of local input/output lines; and a write driver for receiving the data and loading the data on the one pair of global input/output lines, and a global input/output line precharge part for precharging the one pair of global input/output lines with a half of a memory cell array voltage in response to a global input/output line precharge signal, wherein the one pair of local input/output lines is precharged with and dependently on the precharge by which the global input/output lines was precharged.

3. The device of claim 2, further comprising:

a bank selector connected between the one pair of global input/output lines, for selecting a corresponding bank in response to a bank selection signal;

a global input/output sense amplifier connected between the one pair of global input/output lines, for sensing and amplifying the data of the one pair of global input/output lines; and a sense amplifier global input/output line precharge part connected between the bank selector and the global input/output sense amplifier, for precharging one pair of sense amplifier global input/output lines with the half voltage of the memory cell array voltage in response to a sense amplifier global input/output line precharge signal.

4. The device of claim 2, wherein each of the precharge parts includes:

an NMOS transistor connected between the one pair of global input/output lines and driven by the global input/output line precharge signal; and two NMOS transistors connected in series between the one pair of global input/output lines and driven by the global input/output line precharge signal, for providing the one pair of global input/output lines with the half voltage of the memory cell array voltage.

5. A semiconductor memory device having a hierarchical structure, comprising:

one pair of bitlines connected to a memory cell;

one pair of local input/output lines connected to the one pair of bitlines;

one pair of global input/output lines crosswise connected to the one pair of local input/output lines; and a global input/output line precharge part for precharging the one pair of global input/output lines with a half voltage of a memory cell array voltage in response to a global input/output line precharge signal, wherein the one pair of local input/output lines is precharged with and dependently on a voltage by which the global input/output lines were precharged.

6. The device of claim 5, wherein the precharge part precharges the one pair of local input/output lines with the half voltage of the memory cell array voltage when precharging one pair of global input/output lines.

7. The device of claim 6, wherein the precharge part includes:

an NMOS transistor connected between the one pair of global input/output lines and driven by the global input/output line precharge signal; and two NMOS transistors connected in series between the one pair of global input/output lines and driven by the global input/output line precharge signal, for providing the one pair of global input/output lines with the half voltage of the memory cell array voltage.

* * * * *